(12) United States Patent
Chen et al.

(10) Patent No.: US 6,348,360 B1
(45) Date of Patent: Feb. 19, 2002

(54) METHOD FOR PRODUCING SEMICONDUCTOR LASER MODULE

(75) Inventors: Nong Chen; Kiyoshi Takei; Yoshiaki Watanabe; Kiyofumi Chikuma, all of Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/528,156

(22) Filed: Mar. 17, 2000

(30) Foreign Application Priority Data

Mar. 17, 1999 (JP) .............................. 11-071828

(51) Int. Cl.⁷ .............................. H01L 21/00

(52) U.S. Cl. .............................. 438/42

(58) Field of Search .............................. 438/22, 26, 27, 438/42, 43

(56) References Cited

U.S. PATENT DOCUMENTS 5,355,386 A * 10/1994 Rothman et al. ............. 372/50

* cited by examiner

Primary Examiner—Keith Christianson
(74) Attorney, Agent, or Firm—Crowell & Moring LLP (57) ABSTRACT

A method for producing a semiconductor laser module is provided which enables simplifying the production process by eliminating the process of positioning the laser light emitting portion on the substrate, as well as enabling positioning an optical fiber on an appropriate position without aligning the optical fiber with the laser light emitting portion. A semiconductor laser module is fabricated through a process including a substrate preparation step for preparing a substrate including an active layer between cladding layers; a supporting groove portion formation step for forming a supporting groove portion to support an optical fiber on the substrate; and an electrode formation step for forming an electrode on a substrate surface of an opposing portion which faces the supporting groove portion.

4 Claims, 7 Drawing Sheets

METHOD FOR PRODUCING SEMICONDUCTOR LASER MODULE

FIELD OF THE INVENTION

The present invention relates to a method for producing semiconductor laser modules for integrally forming a laser light emitting portion and an optical fiber supporting groove portion on a substrate which contains an active layer in between cladding layers.

BACKGROUND ART

Figure 1:
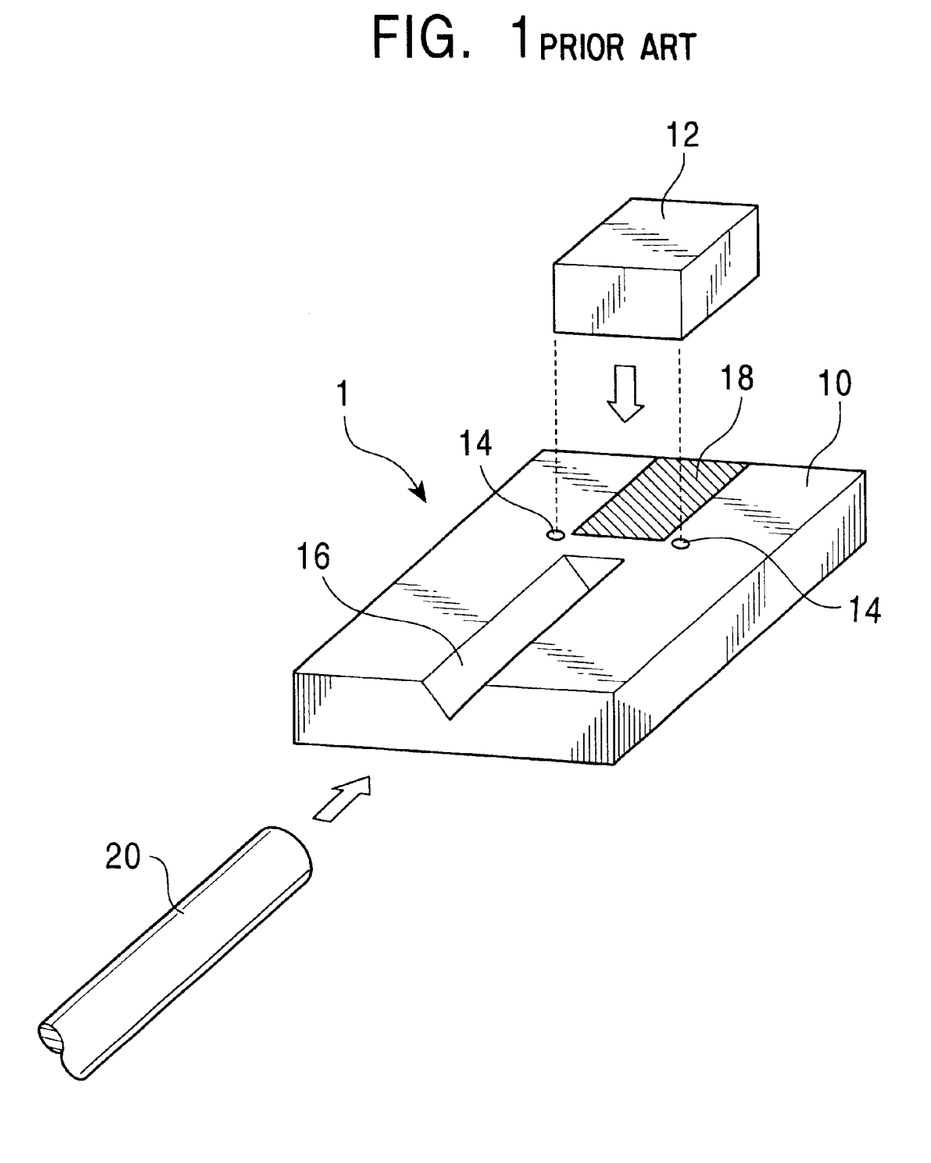
FIG. 1 is a perspective view showing a background art semiconductor laser module.

A semiconductor laser module in which a laser light emitting body and an optical fiber supporting groove are integrated is known as shown in FIG. 1. For example, on a substrate 10 made of Si, markers 14 are provided for positioning the laser light emitting body 12 on the substrate 10 and an optical fiber supporting groove 16 for fixing an optical fiber 20 to a semiconductor laser module 1. In this prior art semiconductor laser module, such a method has been employed to provide the laser light emitting body 12 on the substrate 10 that comprises the steps of providing a soldering material 18, for example, AuSn on the substrate 10; thereafter, positioning an end portion of the laser light emitting body 12 at the markers 14; melting the soldering material 18; and then fixedly mounting the laser light emitting body 12 on the substrate 10.

Furthermore, the optical fiber 20 was fixedly mounted on the optical fiber supporting groove 16 in order to provide the semiconductor laser module 1 with the optical fiber 20 such that the core portion (not shown) of the optical fiber 20 was opposed to the emitting spot (not shown) of the laser light emitting body 12.

SUMMARY AND OBJECTS OF THE INVENTION

In the aforementioned prior-art semiconductor laser module, the laser light emitting body 12 required positioning in place on the substrate 10 to allow, thereafter, the laser light emitting body 12 to be fixedly mounted. Accordingly, in the assembly process of the semiconductor laser module, there was an inconvenience wherein the manufacturing process became complicated since a jig had to be prepared beforehand for positioning the laser light emitting body 12 in place on the substrate 10 and thus a process for positioning the laser light emitting body 12 using this jig was required.

In addition, there was also a problem in that it became difficult to appropriately transmit the laser light emitted from the laser light emitting body to an optical fiber when the laser light emitting body 12 had not been positioned in place on the substrate 10.

In view of the foregoing, an object of the present invention is to provide a method for producing a semiconductor laser module that enables positioning of the optical fiber in an appropriate position without using a jig for positioning the laser light emitting portion, undergoing a process for positioning the laser light emitting portion, or aligning the optical fiber with the laser light emitting portion (alignment free).

The method for producing a semiconductor laser module, according to the present invention, is characterized by comprising a substrate preparation step for preparing a substrate including an active layer between cladding layers; a supporting groove portion formation step for forming a supporting groove portion to support an optical fiber on the substrate; and an electrode formation step for forming an electrode on a substrate surface of an opposing portion which faces the supporting groove portion.

That is, according to the features of the present invention, the production process can be simplified by eliminating the process of positioning the laser light emitting portion on the substrate, and an optical fiber can be positioned on an appropriate position relative to the laser light emitting portion as well.

DETAILED DESCRIPTION OF THE PREFERRED EMBODIMENT

The embodiments of the present invention will be explained below with reference to the drawings. The components corresponding to those shown in FIG. 1 are given the same reference numbers.

Figure 2:
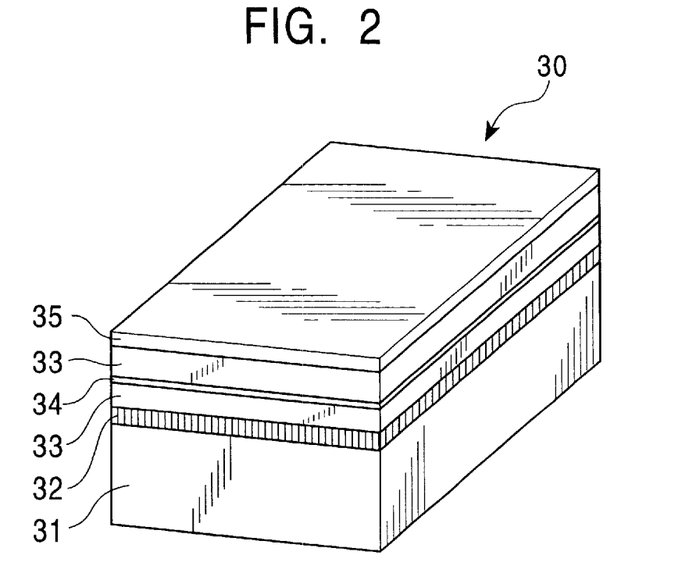
FIG. 2 is a perspective view showing a substrate to be used in a method for producing a semiconductor laser module of a first embodiment of the present invention.

FIG. 2 shows a substrate to be used in a method for producing a semiconductor laser module of a first embodiment of the present invention.

The substrate 30 has an active layer 32, for example, a layer composed of InGaAsP laminated by crystal growth on the upper surface of a first layer 31, being a cladding layer, for example, composed of n-InP and having a predetermined crystal orientation. The substrate 30 also has a second layer 33, being a cladding layer, for example, composed of p-InP further laminated on the active layer 32. Moreover, at around the middle of the second layer 33, an etching blocking layer 34 is laminated which is composed of, for example, p-InGaAsP. On the uppermost surface of the substrate 30, an electrode contact layer 35 composed of, for example, p-InGaAs is laminated. A substrate preparation step constitutes this process of preparing the substrate 30.

In cases where a semiconductor laser module including a distributed feedback laser (DFB laser) is produced, a grating may be provided near the active layer 32 or on the surface of the electrode contact layer 35.

Figure 3:
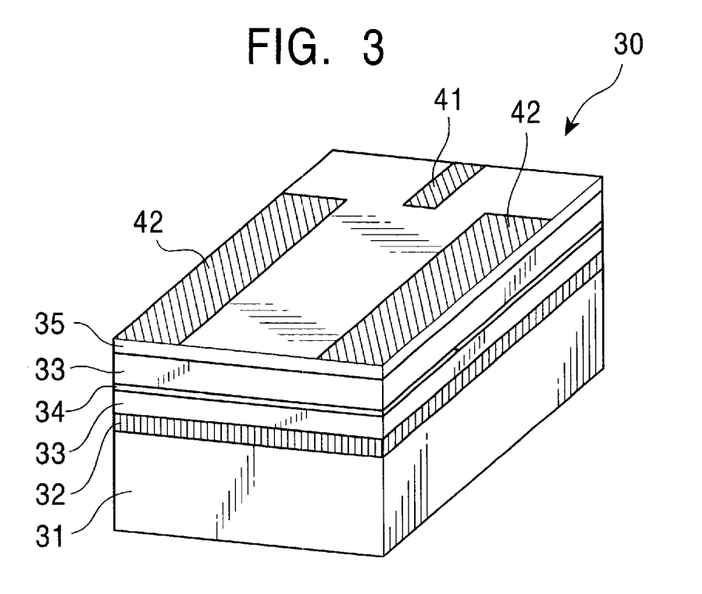
FIG. 3 is a perspective view showing a state where a mask is formed on the substrate shown in FIG. 2.

FIG. 3 shows a state where a mask is formed on the substrate shown in FIG. 2. On the substrate 30, masks 41 and 42 are formed using a non-electrically conductive member, for example, a mask material composed of $SiO_2$. As described later, the mask 41 is to form a laser light emitting portion under a portion thereof, while the mask 42 is to form under a portion thereof a side wall portion to be formed on the side portion of the optical fiber supporting groove portion. This process constitutes the coating formation step.

The process of forming masks 41 and 42 is explained in detail below.

First, $SiO_2$, being a mask material, is formed by sputtering on the entire upper surface of the electrode contact layer 35 of the substrate 30. Then, a resist material composed of photosensitive resin is coated. Subsequently, a glass photo-mask having a pattern drawn beforehand corresponding to the position and size of the masks 41 and 42 to be formed on the substrate 30 is superimposed thereon. Thereafter, the coated resist material is radiated and thus exposed to light such as ultraviolet light from above the glass photo-mask. Portions of the resist material other than those to which the pattern corresponding to the masks 41 and 42 are superimposed become soluble to a given solvent through this exposure treatment. Then, the resist material that has become soluble is dissolved by a given solvent and removed. This removing treatment allows only the resist material corresponding to the position and size of the masks 41 and 42, that are to be formed, to remain on the $SiO_2$ mask material. Subsequently, by performing etching treatment, the mask material is removed allowing only such mask material present under the remaining resist material to remain. Thereafter, by removing only the resist material on top of the mask material, the masks 41 and 42 can be formed on the substrate 30.

Figure 4:
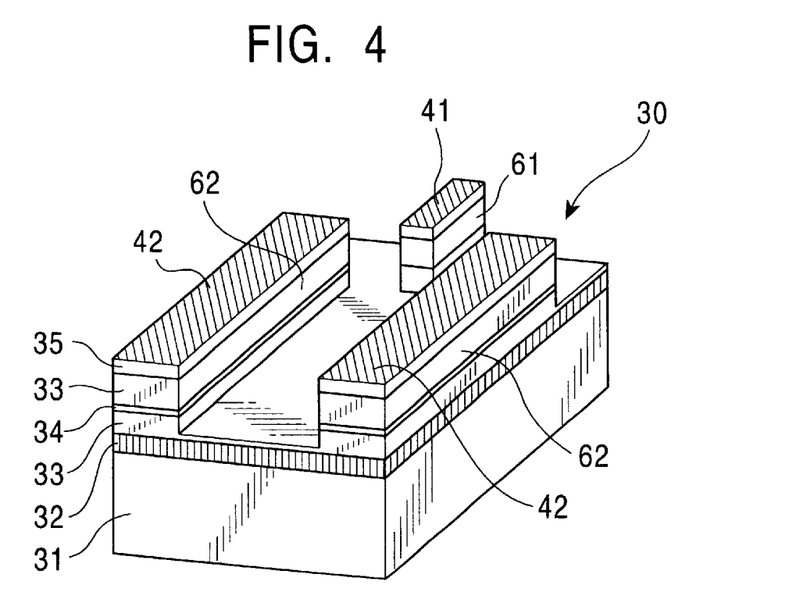
FIG. 4 is a perspective view showing a state of the first etching treated substrate shown in FIG. 2.

FIG. 4 shows a state where a substrate subjected to the mask formation treatment of FIG. 3 has been treated by the reactive ionization etching treatment.

A region that is not covered with the masks 41 and 42 from the surface of the substrate 30 to between the active layer 32 and the etching blocking layer 34 is subjected to the reactive ionization etching treatment, thereby removing the electrode contact layer 35 and the second layer 33 of the cladding layer. The employment of the reactive ionization etching treatment makes it possible to remove in an on-target manner the electrode contact layer 35 and the second layer 33 without being affected by the types of materials that constitute the electrode contact layer 35 and the second layer 33. The first etching treatment step constitutes this etching treatment process. Furthermore, as will be described later, a region under the mask 41 that has been formed with this etching treatment forms a laser light emitting portion 61; a region under the mask 42 forms a side wall portion 62 of the optical fiber supporting groove portion; and a region sandwiched between the side wall portion 62 forms the optical fiber supporting groove portion.

Figure 5:
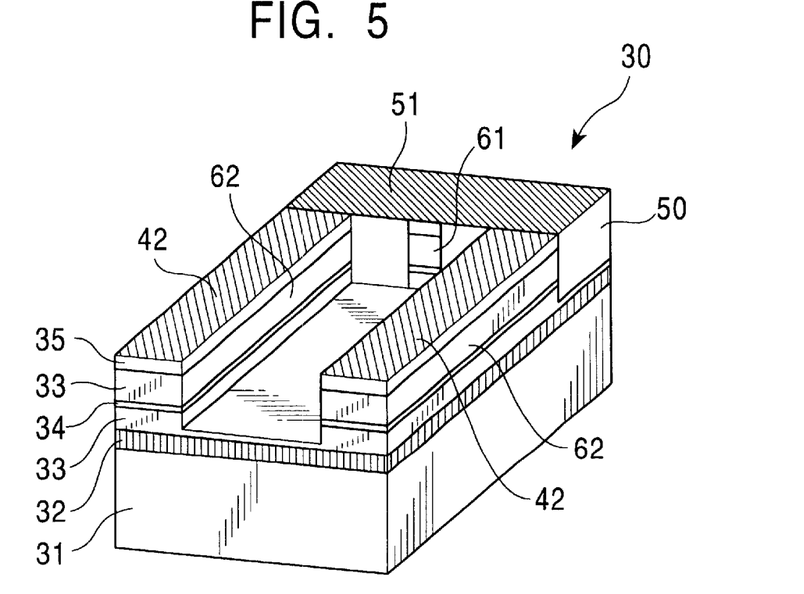
FIG. 5 is a perspective view showing a state where an electrical insulating member is formed on the side wall portion of the laser light emitting portion.

FIG. 5 shows a state where an electrical insulating member has been formed on the side wall portion of the laser light emitting portion 61 of the substrate having been subjected to the etching treatment of FIG. 4.

This process constitutes the step of embedding an electrical insulating member 50 such as a water glass or polyimide by spin coating in the entire upper surface of the substrate that has been subjected to the aforementioned reactive ionization etching treatment. This process also constitutes the step of removing, with the reactive ionization etching treatment, the electrical insulating member that has been embedded in the region that is to become the optical fiber supporting groove portion, after a mask 51, for example, an Al vapor-deposited film has been formed in the laser region including the laser light emitting portion. An insulating layer formation step constitutes this process.

Figure 6:
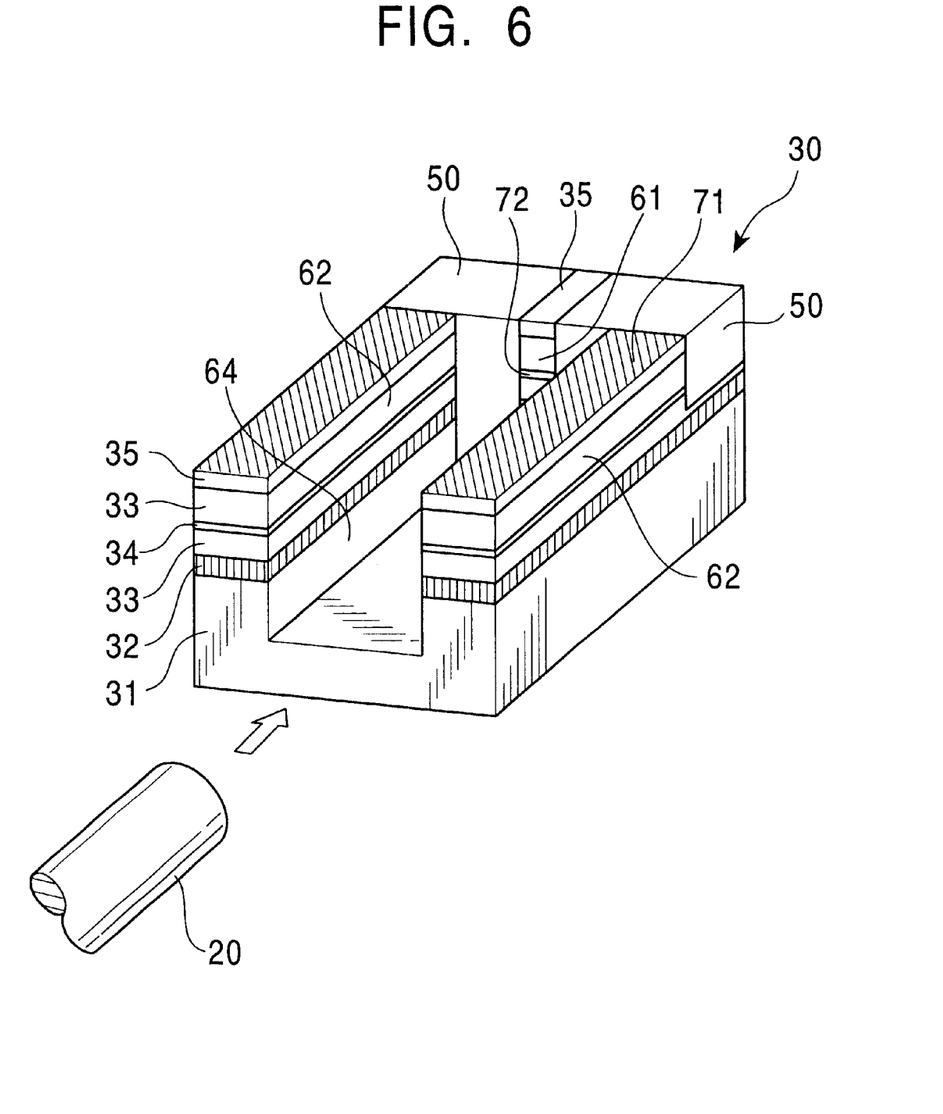
FIG. 6 is a perspective view showing a semiconductor laser module produced by a method for producing a semiconductor laser module of a first embodiment of the present invention.

FIG. 6 shows a semiconductor laser module produced by a method of a first embodiment of the present invention.

After an optical fiber supporting groove portion 64 has been formed down to a predetermined depth with the reactive ionization etching treatment on the substrate 30 subjected to the formation treatment of the electrical insulating member shown in FIG. 5, the mask 51 formed on the laser light emitting portion 61 and on the upper surface the insulating member 50 formed on the side of the laser light emitting portion 61 is removed. Then, the electrode contact layer 35 is exposed to the upper surface of the laser light emitting portion 61. Thereafter, an electrode film is evaporated, thereby forming an electrode (not shown) and completing the production process of the semiconductor laser module. The electrode formation step constitues this process.

By producing a semiconductor laser module according to the aforementioned processes, the optical fiber supporting groove portion 64 and the laser light emitting portion 61 formed by forming an electrode on an opposing portion that faces the optical fiber supporting groove portion 64 can be integrally formed at the same time on a substrate. In addition, the cross-sectional shape of the optical fiber supporting groove portion 64 is formed in the shape of a rectangle, thereby facilitating the etching treatment process.

Figure 7:
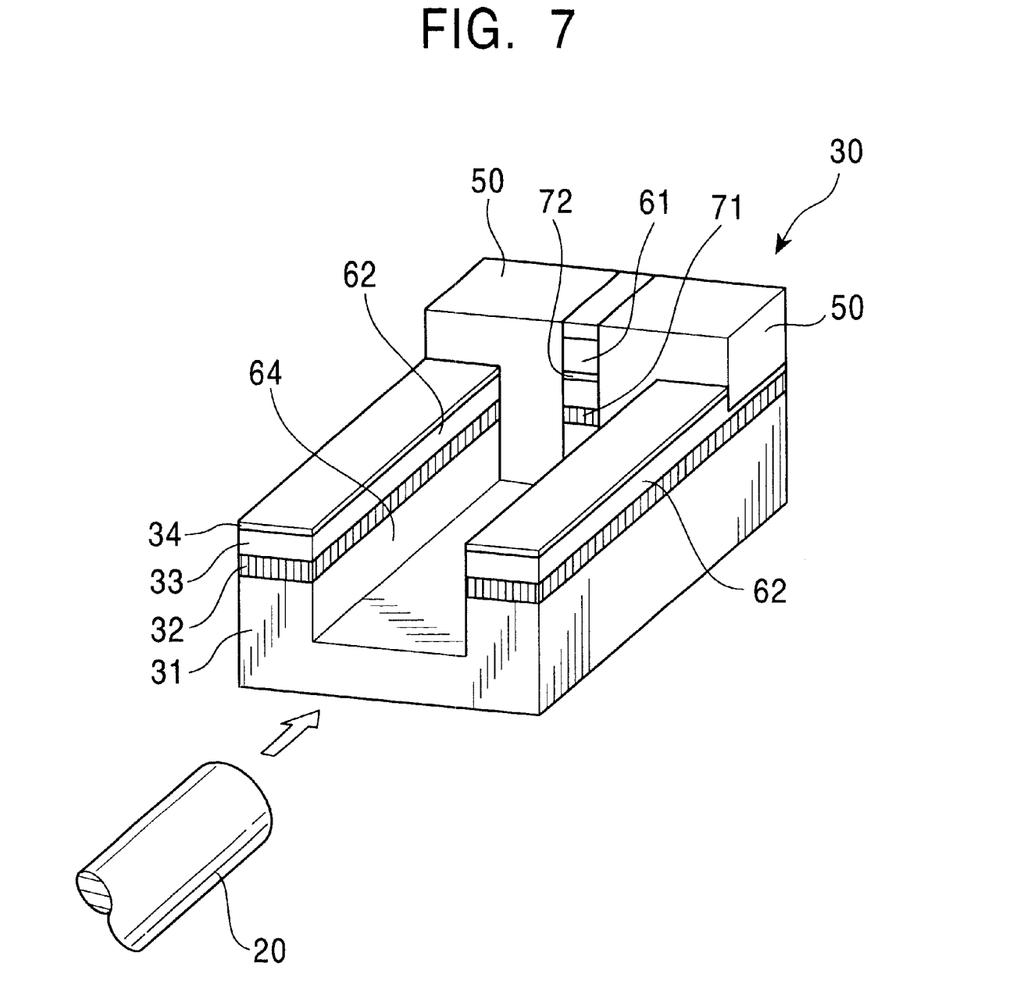
FIG. 7 is a perspective view showing a semiconductor laser module produced by a method for producing a semiconductor laser module of a second embodiment of the present invention.

FIG. 7 shows a semiconductor laser module produced by a method of a second embodiment of the present invention. The components corresponding to those shown in FIG. 6 are give the same reference numbers.

First, the substrate 30 subjected to the electrical insulation substance formation treatment shown in FIG. 5 is subjected to the reactive ionization etching treatment, thereby removing the cladding layer 33 and the active layer 32 until the region not covered by the mask 51, that is, the region forming the optical fiber supporting groove portion reaches a depth at which the laser active layer is penetrated. Moreover, on the side wall portion 62, etching is allowed to be carried out down to the upper surface of the etching blocking layer 34. Subsequently, with anisotropic etching by means of a predetermined etching solution, for example, an InP selective etching solution comprised of a hydrochloric-acid based solution, the InP layer 31 is removed such that only the region that is to form the optical fiber supporting groove portion reaches down to a predetermined depth to form the side wall portion 62, the optical fiber supporting groove portion 64, and a laser light emitting plane 72 that contains a laser light emitting spot 71 directed to the optical fiber supporting groove portion 64. Thereafter, the mask 51 is removed to form an electrode (not shown) by exposing the electrode contact layer 35 on the upper surface of the laser light emitting portion 61 and thus the production process of the semiconductor laser module is completed.

Figure 8:
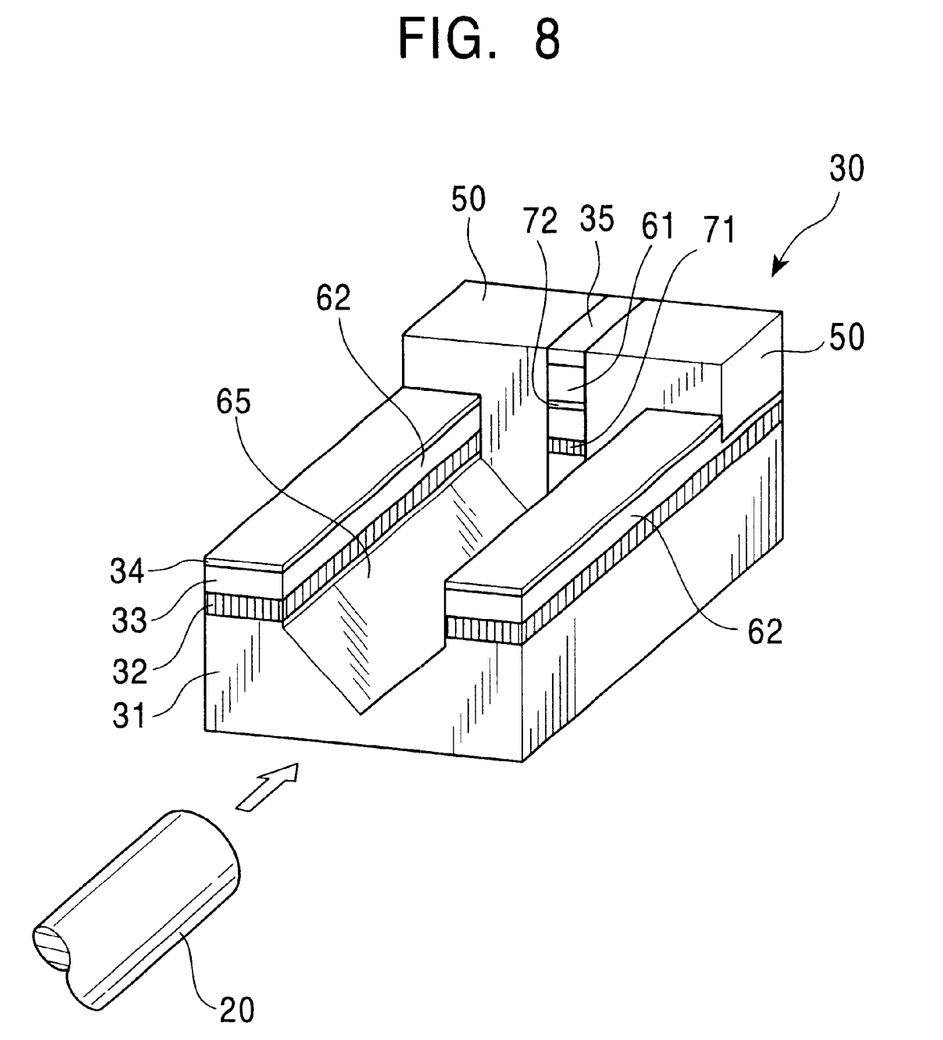
FIG. 8 is a perspective view showing a semiconductor laser module produced by a method for producing a semiconductor laser module of a third embodiment of the present invention.

FIG. 8 shows a semiconductor laser module fabricated by a method of a third embodiment of the present invention. The components corresponding to those shown in FIG. 6 are given the same reference numbers.

First, like the method for producing a semiconductor laser module according to the aforementioned second embodiment, the substrate 30 subjected to the electrical insulation substance formation treatment shown in FIG. 5 is subjected to the reactive ionization etching treatment, thereby removing the cladding layer 33 and the active layer 32 until the region not covered by the mask 51, that is, the region forming the optical fiber supporting groove portion reaches a depth at which the laser active layer is penetrated, and allowing etching to be carried out down to the upper surface of the etching blocking layer 34 on the side wall portion 62. Subsequently, with anisotropic etching by means of, for example, an InP selective etching solution comprised of a hydrochloric-acid based solution, the InP layer 31 is removed whereby only the region that is to form the optical fiber supporting groove portion forms the cross-sectional shape of the bottom portion of an optical fiber supporting groove portion 65 in the shape of the letter V. Thereafter, the mask 51 is removed to form an electrode (not shown) by exposing the electrode contact layer 35 on the upper surface of the laser light emitting portion 61 and thus the production process of the semiconductor laser module is completed.

Forming the substrate 30 in a manner such that the InP layer is laminated so as to have a given crystal orientation beforehand at the time of preparing the substrate 30 allows the cross-sectional shape of the optical fiber supporting groove portion 65 to be formed in the shape of the letter V only with the aforementioned anisotropic etching treatment. By forming the cross-sectional shape of the bottom portion of the optical fiber supporting groove portion 65 in the shape of the letter V, the optical fiber 20 can be positioned within the optical fiber supporting groove portion 65 with accuracy.

Figure 9:
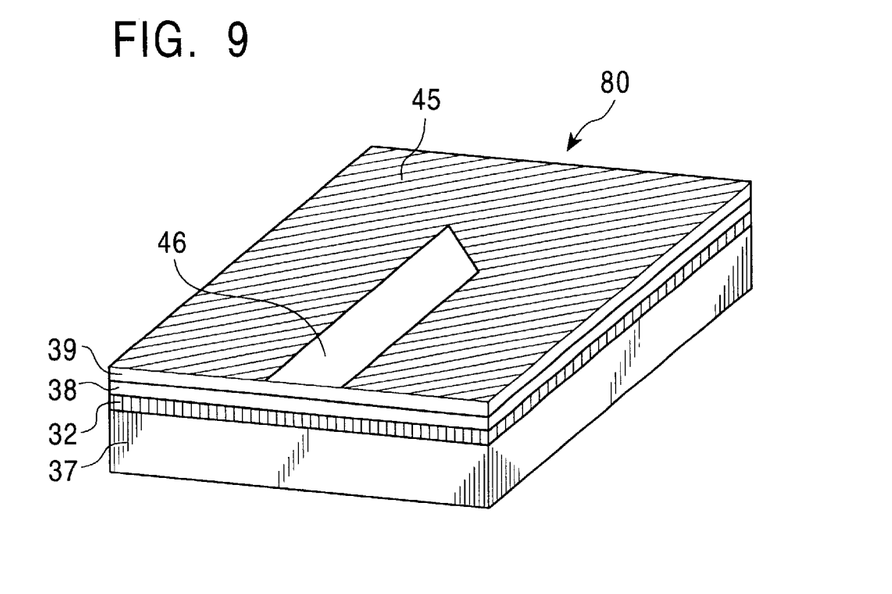
FIG. 9 is a perspective view showing a substrate to be used in a method for producing a semiconductor laser module of a fourth embodiment of the present invention.

FIG. 9 shows a substrate to be used in a method for producing a semiconductor laser module of a fourth embodiment of the present invention. The components corresponding to those shown in FIG. 2 are given the same reference numbers.

A substrate 80 is formed, between cladding layers 37 and 38 composed of, for example, InP, by epitaxial growth of the active layer 32 composed of, for example, InGaAsP and an electrode contact layer composed of, for example, InGaAs and the like.

On the substrate 80, a laser waveguide 81 is formed with the etching treatment, selective growth or the like, and an electrical insulating member, for example, $SiO_2$ is laminated on a region other than the waveguide strip (not shown) to form a surface electrode layer, and thereafter a mask 45 is formed so as to allow the laser waveguide 81 and a region 46 to be opposed to the surface of the upper portion of a substrate 36 except for the region 46 that forms the optical fiber supporting groove portion by means of a method similar to that in the mask formation process explained in FIG. 3.

Figure 10:
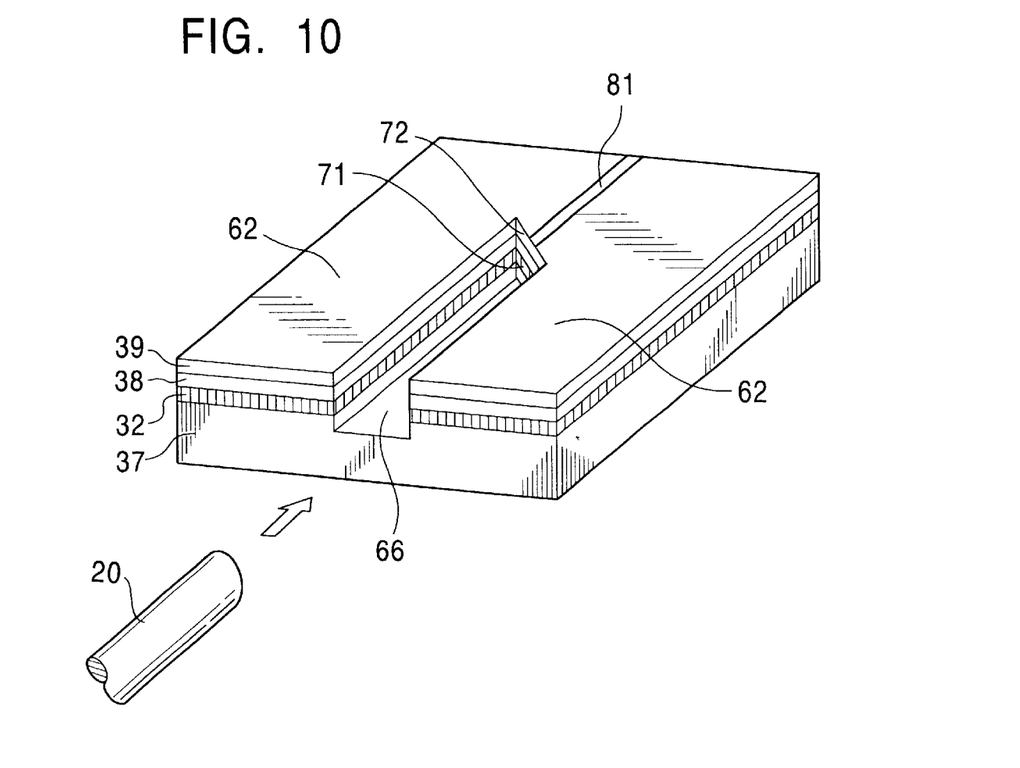
FIG. 10 is a perspective view showing a semiconductor laser module fabricated by a method for producing a semiconductor laser module of a fourth embodiment of the present invention.

FIG. 10 shows a semiconductor laser module fabricated by a method for producing a semiconductor laser module, as a fourth embodiment of the present invention.

In the region 46 where the mask 45 is not covered, down to a predetermined depth at which the active layer 32 is penetrated, for example, the surface electrode layer and the electrode contact layer are subjected to chemical etching treatment; the electrical insulating member is subjected to fluoric-acid based etching treatment; and the cladding layers 37 and 38 and active layer 32 are subjected to $Cl_2$ ionization etching treatment, thereby removing the respective layers to form an optical fiber supporting groove portion 66, the side wall portion 62, and the laser light emitting plane 72 including the laser light emitting spot 71 directed toward the optical fiber supporting groove portion 66. Thereafter, the mask is removed and then the production process of a semiconductor laser module is completed.

In cases where a semiconductor laser module is fabricated by the method according to the aforementioned fourth embodiment, the production process can be further simplified. The laser light emitting plane 72 has been shown as a plane inclined relative to the optical fiber supporting groove portion 66, although the angle of inclination may be equal to zero relative to the optical fiber supporting groove portion 66. The inclined plane can be affected less by reflected light to return to the laser.

As described in the foregoing, the method for producing a semiconductor laser module, according to the present invention, allows for forming the optical fiber supporting groove portion and the laser light emitting portion integrally on a substrate at the same time. For this reason, the process for positioning the laser light emitting portion on the substrate can be eliminated and thus the production process can be simplified. At the same time, positioning an optical fiber to an appropriate position relative to the laser light emitting portion can be facilitated.

What is claimed is:

1. A method for producing a semiconductor laser module comprising:

a substrate preparation step for preparing a substrate including an active layer between cladding layers;

a supporting groove portion formation step for forming a supporting groove portion to support an optical fiber on said substrate; and an electrode formation step for forming an electrode on a substrate surface of a portion of said substrate which is adjacent said supporting groove portion;

wherein said cladding layers comprise a first layer and a second layer including an etching blocking layer, and said active layer is laminated between said first layer and said second layer; and wherein said supporting groove portion formation step comprises a first coating formation step for forming first coating regions by coating a first nonconductive member onto substrate surface areas corresponding to side wall portions of said supporting groove portion, and onto an adjacent substrate surface portion that adjoins an end of said supporting groove portion;

a first etching treatment step for etching regions other than said first coating regions, from said substrate surface through said second layer to said etching blocking layer;

an insulating layer formation step for forming an insulating layer in regions etched in said first etching treatment step;

a second coating formation step for forming a second coating region by coating a second nonconductive member onto said adjacent substrate surface portion and onto regions of said insulating layer other than said supporting groove portion; and a second etching treatment step for etching regions other than said second coating region and said side wall portions down to a depth of said first layer to penetrate said active layer.

2. The method for producing a semiconductor laser module according to claim 1, wherein said supporting groove portion has a cross section in the shape of a rectangle.

3. The method for producing a semiconductor laser module according to claim 1, wherein a bottom portion of said supporting groove portion has a V-shaped cross section.

4. A method for producing a semiconductor laser module comprising a substrate with a supporting groove for supporting an optical fiber on said substrate, said method, comprising:

preparing a substrate having an active layer between cladding layers;

forming first coating regions on a surface of said substrate by applying a first nonconducting member onto substrate surface areas corresponding to side wall portions of said supporting groove, and onto an adjacent substrate surface portion that adjoins an end of said supporting groove;

etching regions other than said first coating regions, in a first etching step;

forming an insulating layer in regions etched in said first etching step;

forming a second coating region by applying a second nonconductive member onto said adjacent substrate surface portion and onto regions of said insulating layer other than in an area of said supporting groove;

etching regions other than said second coating region and said sidewall portions, forming said supporting groove, to a depth which penetrates said active layer; and forming an electrode on said adjacent substrate surface portion.

* * * * *